Figure 1:
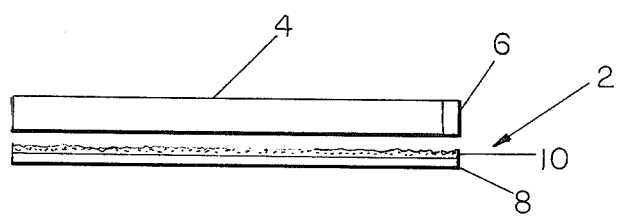

United States Patent [19]

Boling

[11] 4,188,239
[45] Feb. 12, 1980

[54] LUMINESCENT SOLAR COLLECTOR STRUCTURE

[75] Inventor: Norman L. Boling, Toledo, Ohio

[73] Assignee: Owens-Illinois, Inc., Toledo, Ohio

[21] Appl. No.: 965,446

[22] Filed: Nov. 30, 1978

[51] Int. Cl.² .................................... H01L 31/04
[52] U.S. Cl. ...................... 136/89 FC; 136/89 CA; 250/227
[58] Field of Search ........ 136/89 FC, 89 CL, 89 CA; 250/227

[56] References Cited

U.S. PATENT DOCUMENTS 4,130,445  12/1978  Blieden ........................ 136/89 PC

OTHER PUBLICATIONS

A. Goetzberger et al., "Solar Energy Conversion with Fluorescent Collectors", *Appl. Phys.*, vol. 14, pp. 123-139 (1977).

*Primary Examiner*—Aaron Weisstuch
*Attorney, Agent, or Firm*—Charles S. Lynch; M. E. Click; D. H. Wilson

[57] ABSTRACT

Disclosed is a luminescent solar collector optically coupled to a photovoltaic cell and in confronting relationship thereto a diffusing layer of a particulate phosphorescent material deposited on and backed by a mirror.

3 Claims, 2 Drawing Figures

LUMINESCENT SOLAR COLLECTOR STRUCTURE

This invention concerns the art of exposing semi-conductors to sunlight to convert at least a part thereof to electrical energy. Such means for converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive; in consequence, it has been the practice to gather and concentrate the sunlight reaching a given semiconductor photocell so that such extremely large areas of semiconductor material need not be employed as would be necessary without such a gathering system. The common gathering systems in the past were optical systems, wherein lens systems concentrated the light and focused same on a given photocell.

However, such a lens system was and is relatively expensive and is not useful in diffuse light on a cloudy day. More recently, however, there has been conceived a different type of collector or concentrator of radiation to be impinged on a semiconductor photocell. For instance, Weber and Lambe in Applied Optics, Vol. 15, pages 2299–2300, October 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way, the light from the sun is not only converted to more suitable wave lengths for activation of the photocell, but is concentrated since the light received by the large area of the collector escapes only in the small area where the photocell is optically connected to the collector.

Another article, by Levitt and Weber, appearing in Applied Optics, Vol. 16, No. 10, pages 2684–2689, October 1977, should be read with the article first mentioned.

Other publications aiding in the understanding of the luminescent solar collectors include Goetzberger, Applied Physics, 14, 123–139, 1977, U.S. Pat. No. 4,110,123 issued Aug. 29, 1978, claiming priority in part based on German patent applications No. 2620115 published Nov. 10, 1977, filed May 6, 1976, and No. 2628917 published Jan. 12, 1978, filed June 24, 1976, and, referred to in the former patent application, German patent application No. 2554226, published June 8, 1977, which is of some peripheral interest. The noted Goetzberger Applied Physics paper which is of more direct interest with respect to the claims herein, discloses a relatively complicated structure in FIG. 18b (in the sense that it contains between the bottom mirror layer and the top paint layer, a composite layer of glass containing scattering centers) for utilizing diffuse radiation in connection with a luminescent solar collector $C_1$, which is superimposed over a composite structure of a glass plate "collector" $C_2$ containing scattering centers, backed by a mirror M and coated on top with a paint film F containing fluorescent particles.

Also, numerous patents deal with the conversion of solar energy to different wavelengths by means of luminescent or fluorescent layers and impinging emitted light on a photocell; examples are U.S. Pat. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931 benzene and other aromatic hydrocarbons are said to be "fixed" in layers of a silicone resin superimposed on the photocell.

As used herein and in the claims the term "luminescent solar collector" means a radiation collection medium comprising a light conducting medium having two opposing, usually parallel, surfaces of extended area relative to the other surfaces of said medium (such as edges), which light conducting medium contains a luminescent species that absorbs solar radiation of one wave length and emits at a longer wavelength. Of course, in accordance with well understood optical principles (Snells law), that portion of the emitted luminescent radiation generated at larger angles than the critical angle relative to a line perpendicular to a given extended surface of the medium is trapped within the medium by the process of total internal reflection. Such portion for a flat sheet having an index of refraction of 1.5 is about 75 percent, as is well-known. As is well-known, a luminescent solar collector, because of total internal reflection, collects and concentrates the trapped luminescent radiation and can deliver it to a relatively small area of the collector, such as a small area or areas of the collector face or one or more or all of the edges of the luminescent radiation collection medium, where it can be optically coupled to a desired means, such as to a photovoltaic cell. In the structures of the present invention a relatively small area (edge or face area) of the luminescent solar collector is in fact optically coupled to a photovoltaic cell or cells. By "optically coupled" as used herein is meant that there is a low or minimum reflection at the interface of the photocell and the collection medium or trapping sheet.

It will also be understood that the radiation collection medium has smooth extended surfaces essentially parallel to each other. Rough surfaces, as will be understood, would defeat the object of obtaining total internal reflection. For the same reason, all layers of such radiation collection medium are of course continuous and uninterrupted and contain no particulates dispersed therein, unless such particles have diameters well below the wavelength of any electromagnetic radiation utilized to activate the fluorescent species or the solar cells.

It is emphasized that the definition of a "luminescent solar collector" herein is broad, that the "light conducting medium" of said definition can be one layer or two or more layers, each being of a homogeneous, continuous, light conducting material such as plastic or glass, each layer being optically coupled to the next, to make the collector or trapping medium. One or more, or all, of the layers can contain a luminescent species as defined. When a luminescent species is present in more than one such layer the absorption band of one can advantageously overlap the emission band of the other species, thus coupling or cascading the emission of one luminescent species to the absorption of another. Or two or more such "coupled" luminescent species can be present in a given layer of the collection medium so that, again, the emission spectrum of one overlaps the absorption spectrum of the other in a cascade arrangement, as in Swartz et al. in Optics Letters, Vol. 1, No. 2, August 1977, pp. 73-75, and in Science News, Vol. 112, No. 20, Nov. 12, 1977, pp. 313-314, or as on page 130 of the cited Goetzberger et al. publication.

On the other hand, when more than one luminescent species is present in a luminescent solar collector, either in the same layer or the sole layer as the case may be, or in different, coupled light conducting layers of a given luminescent solar collector, the emission band of one such luminescent species need not overlap the absorption band of the next longer wave length luminescent species in said collector. In such event the emission bands would both be delivered to the photocell, or if two luminescent solar collectors are used as in FIG. 7 of the Goetzberger paper, each collector will deliver two wavelengths to the photocell associated with it.

The concept and structure of a luminescent solar collector coupled to at least one photovoltaic cell, of the general type described hereinbefore, but having a light conducting medium of two or more homogeneous, continuous layers physically and optically coupled to one another, wherein said light conducting medium is optically and physically coupled to a photocell, is described in a paper entitled "Luminescent Solar Concentrator" by C. F. Rapp and N. L. Boling presented before the Thirteenth IEEE Photovoltaic Specialists Conference, June 5-8, 1978 in Washington, D.C. at the Americana Hotel, published September 1, 1978, on pp. 690-93 of the "Conference Record, Thirteenth Photovoltaic Specialists Conference 1978", Institute of Electrical and Electronic Engineers, New York, N.Y. See also Optical Spectra, April 1978, under heading "Industry Briefs." A similar structure is disclosed by Mauer et al. in Research Disclosure, October 1977, pages 43-44, published by Industrial Opportunities, Ltd., Homewell, Havant, Hampshire, England.

In the past the solid inorganic phosphorescent materials, i.e., solid inorganic luminescent materials having a decay time greater than $10^{-8}$ seconds, have not been used in connection with luminescent solar collectors because the particulate solids provide diffuse luminescent radiation and thus cannot be trapped in the collector by the process of total internal reflection. One exception to this is disclosed in application Ser. No. 921,417, filed July 3, 1978, of limited applicability.

The lack of use of such phosphorexcent materials in conjunction with such systems is unfortunate since such phosphorescent materials have a high quantum efficiency, e.g. a large (70 percent plus) portion of the electromagnetic radiation absorbed by such materials is converted to longer wavelength electromagnetic radiation, the balance being converted to heat.

It is an object of the present invention to provide a luminescent solar collector coupled to a photovoltaic cell for producing electricity, which collector utilizes not only solar radiation but also diffuse luminescent radiation derived from a diffusing layer of phosphorescent particles.

It is a further object of the invention to provide a method and structure for utilizing phosphorescent particulate materials in connection with a luminescent solar collector optically coupled to a photovoltaic cell to produce electricity.

Other objects, as well as aspects and advantages, of the present invention will become apparent from a study of the specification and drawings herein.

According to the present invention there is provided a luminescent solar collector in the form of a flat plate, optically coupled to at least one photovoltaic cell on a relatively small or minor portion of the surface area thereof such as a small portion of one face thereof or one or more edge surfaces thereof; and parallel to, facing, and spaced apart from said collector a layer of particulate phosphorescent material of a rough, diffusing physical structure, deposited on and backed by a mirror which is reflective of luminescent radiation produced by said phosphorescent material on activation, said phosphorescent material being responsive to solar radiation wavelengths which pass through said collector when said collector is exposed to solar radiation or radiation of solar wave lengths, wherein said luminescent solar collector contains at least one luminescent species which can be activated by luminescent emission from said phosphorescent material.

The edge surfaces of the luminescent solar collector plate of the present invention not coupled to a photocell usually carry a highly reflective or mirror coating. However, this is not absolutely necessary since the light exiting from uncoated edges can be piped to other utilization such as to absorption by a black body to produce heat.

A particular advantage of being able to use solid inorganic phosphorescent materials according to the present invention in connection with luminescent solar collectors is that these luminescent materials characteristically have much wider absorption bands than soluble luminescent materials such as the fluorescent dyes. Thus, if one is to convert as much as possible of the solar radiation to luminescent radiation which can be trapped by total internal reflection and coupled out to a photocell, it is necessary when using dyes to have a series of four and usually more dyes whose absorption bands cover as much of the solar spectrum as possible. But with the inorganic solid phosphorescent materials there is a much wider absorption band. For instance, the zinc sulfide: copper phosphor of Sylvania Electronic Products, Inc. known as Type 911, has an absorption bandwidth (50%) of from about 300 to about 495 nanometers. As will be seen by reference to the specific example herein a wide portion of the solar spectrum is utilized by using this phosphor and using just two fluorescent dyes in the luminescent solar collector.

Figure 2:
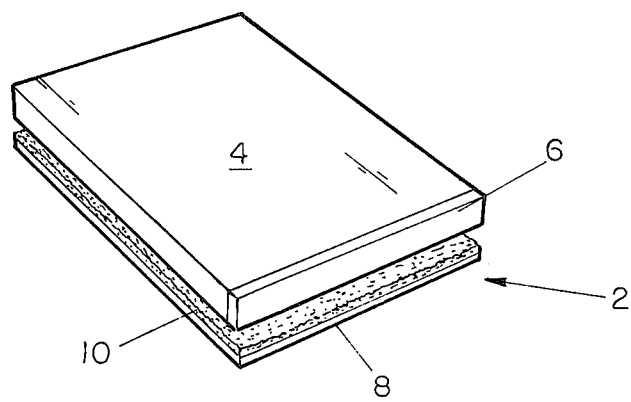

FIG. 1 is a front view and FIG. 2 is a perspective view of a structure of the present invention.

Luminescent solar collector 4 (as defined herein), has a photovoltaic cell 6 optically and physically coupled to one edge thereof. The other edges have applied thereto a highly reflective coating or mirror. Beneath collector 4 is mirror 8, a sheet of high reflective material, and on said mirror 8 is deposited a layer of inorganic particulate phosphorescent material 10 of a rough, diffusing physical structure. The composite mirror-phosphorescent material is essentially parallel to and facing, but spaced apart from collector 4, although in close proximity thereto. If desired, the mirror 8 can be bent around at the edges essentially perpendicular to the collector plate 4 in order to prevent escape of a small amount of radiation that might otherwise escape.

In operation, the sun's rays hit the top face of luminescent solar collector 4 and at least a portion of the shorter wave lengths of the solar spectrum pass through the plate 4 and activate the phosphorescent material 10. The luminescent output of the phosphorescent material is essentially all reflected back to the luminescent solar collector 4. This is because the rough and discontinuous nature of layer 10 and the particulate character of layer 10 produces diffused radiation, and because mirror surface 8 directs all radiation hitting such surface back in the direction of collector 4. Luminescent radiation from the phosphorescent material 10 activates a luminescent material, such as an organic dye contained in the luminescent solar collector 4, and a large proportion of this luminescent radiation from the dye is trapped in the collector 4 by the process of total internal reflection until it finds its way to photovoltaic cell 6 where electricity is produced and recovered by means of conductor leads connected on either side of the P-N junction of the photocell, as will be understood although such electrical leads are not shown.

Further, luminescent solar collector 4 can contain several dyes of different absorption and emission spectra. For instance, one dye can have an absorption spectra that is activated by the emission spectra of the phosphor 10 and the emission spectra of the dye can be such that it overlaps the absorption spectra of the second dye, so that the emission spectra of the second dye is the principal luminescent radiation that reaches the photovoltaic cell 6.

Of course, in the foregoing description of the figures, it was not discussed that when the sun's rays are absorbed by the luminescent species in luminescent solar collector 4, the solar rays coinciding with the absorption spectra of each luminescent species in luminescent solar collector 4 will be absorbed by the respective luminescent species and activate the species, in addition to the activation coming from the emission of the phosphorescent material 10.

In a specific example of the invention, to a 25 weight percent aqueous solution of polyvinyl alcohol (containing 10–12% residual acetate groups) is dissolved 54 milligrams of sulforhodamine 101 and 45 milligrams of rhodamine 6G. This solution is spin coated onto a 12-inch square by $\frac{1}{8}$ inch thick poly(ethylene terphthalate) plate. Enough of the solution is retained so that after drying in an oven at 80° C. for 10 to 15 minutes a coating of about 1 mil thickness remains. Thereafter an unsaturated liquid polyester resin (a polyester resin condensed to a liquid state and containing ethylenic unsaturation through which addition polymerization will harden the resin) known as Duro brand "Fiberglas Resin", a product of Woodhill Chemical Sales Corporation, Cleveland, Ohio, is mixed with the hardener or catalyst. Four ounces of the resin are mixed with thirty drops of the hardener, which is methyl ethyl ketone peroxide in phthalate ester. About 35 grams of this polyester resin containing the catalyst is spread over the polyvinyl alcohol coating on the poly(ethylene terephthalate) plastic with a spatula to a roughly even state, and then an identical $12'' \times 12'' \times \frac{1}{8}''$ thick poly(ethylene terephthalate) plate is pressed down firmly over the top of the hardenable polyester resin. After about one-half hour the polyester resin has hardened, leaving a laminate of the 1 mil thick fluorescent polyvinyl alcohol layer sandwiched between the two $\frac{1}{8}$ inch plastic sheets, and optically and physically bonded to both of them.

Sulforhodamine 101 is 8-(2,4-Disulfophenyl)-2,3,5,6,11,12,14,15-1H.4H.10H.13H-octahydrodiquinolizino[9,9a,1-bc;9,9a,1-hi]xanthylium Hydroxide Inner Salt, and Rhodamine 6G is Ethyl o-[6-(Ethylamino)-3-(ethylimino)-2,7-dimethyl-3H-xanthen-9-yl]benzoate Chloride.

Next, three four-inch long and $\frac{1}{4}$ inch thick silicon photovoltaic cells are applied end to end along one edge of the luminescent solar collector plate which is $\frac{1}{4}$ inch thick. Each of the cells has appropriate electrical leads on either side of the P-N junction and the cells are positioned end to end on the edge, almost touching, but not quite. The cells are applied to the edge by painting a thin film of polysiloxane solution on the face of the cell, applying the cell to the edge, and allowing the solvent to evaporate. The polysiloxane solution is a 50 volume percent solution in butanol of partially cured by further cureable resin prepared as described in Example 1 of U.S. Pat. No. 3,395,117 (incorporated herein by reference). The butanol eventually evaporates, leaving the cells bonded with the resin. Finally, a highly reflective aluminum coating is applied to the other three edges of the luminescent solar collectors.

Next, a dispersion of a zinc sulfide: copper phosphorescent material of a Fisher sub-sieve sizer number of 20 microns is used to make a slurry. The phosphor is the Sylvania Type 911 phosphor previously described. 4.5 parts by weight of the phosphor and 1 part by weight of nitrocellulose are dispersed in 12 parts by weight methyl ethyl ketone. The nitrocellulose binder, of course, dissolves and the phosphor is merely dispersed in the solution. The phosphor is sprayed with a spray gun onto the surface of a highly polished 12-inch square flat aluminum sheet. Enough of the suspension is sprayed to form a film when dried of about 2–3 mils thick, and the phosphor coating is allowed to dry. The aluminum plate is supported very close to the bottom of the luminescent solar collector as in the figures, about 2 mils below the bottom or as close as possible without touching.

In operation, when the assembly is exposed to sunlight, the sunlight activates the dyes in the luminescent solar collector, and the shorter wavelengths that are not absorbed by the polyester go through the luminescent solar collector and strike the phosphor which emits at a peak of about 530 nanometers, and the diffused light produced goes directly and by reflection from the mirror back into the luminescent solar collector where it activates the Rhodamine 6G whose absorption peak is at 530 nanometers. The emission output of the Rhodamine 6G activates the Sulforhodamine 101 with its emission maximum being at about 552 nanometers and the Sulforhodamine 101 absorption peak being about 576 nanometers, but with a good overlap with the output of the Rhodamine 6G. Furthermore, the emission of the phosphor on the aluminum plate has a broad band width of 70 nanometers (50%) and it therefore also directly activates the Sulforhodamine 101. The trapped radiation, mainly the radiation from the Sulforhodamine 101 finds its way to the solar cells which it activates to produce electricity.

As will be evident to those skilled in the art, various modifications of this invention can be made or followed in the light of the foregoing disclosure and discussion without departing from the spirit and scope of the disclosure or from the scope of the claims.

I claim:

1. A luminescent solar collector in the form of a flat plate, optically coupled to at least one photovoltaic cell on a relatively small or minor portion of the surface area thereof; and essentially parallel to, facing, and spaced apart from said collector a layer of particulate phosphorescent material of a rough, diffusing physical structure, deposited on and backed by a mirror which is reflective of luminescent radiation produced by said phosphorescent material on activation, said phosphorescent material being responsive to solar radiation wavelengths which pass through said collector when said collector is exposed to solar radiation or radiation of solar wavelengths, wherein said luminescent solar collector contains at least one luminescent species which can be activated by luminescent emission from said phosphorescent material.

2. A structure of claim 1 wherein edge surfaces of said flat plate not coupled to photovoltaic cells have a highly reflective coating thereon.

3. A method of converting solar radiation to electricity which comprises impinging solar radiation on a luminescent solar collector plate having at least one operative photovoltaic cell optically coupled to a relatively small surface area thereof, and absorbing a portion of the wavelengths of solar radiation to activate luminescent species contained therein, passing a portion of wavelengths of solar radiation, which are shorter than the first mentioned wavelengths, through said plate and impinging said wavelengths on a rough, diffusing layer of particulate solid inorganic phosphorescent material deposited on a mirror to activate said phosphorescent material to produce longer wavelength luminescent radiation emission from said phosphorescent material and reflecting back such luminescent radiation into said luminescent solar collector to activate luminescent species therein, and converting to electricity trapped luminescent radiation created within said collector and reaching said at least one coupled photovoltaic cell by the process of total internal reflection.

* * * * *

UNITED STATES PATENT AND TRADEMARK OFFICE
CERTIFICATE OF CORRECTION

PATENT NO. : 4,188,239
DATED : February 12, 1980
INVENTOR(S) : Norman L. Boling

It is certified that error appears in the above-identified patent and that said Letters Patent are hereby corrected as shown below:

Column 6, line 18, "by" should read --but--.

Signed and Sealed this

Eighth Day of July 1980

[SEAL]

Attest:

SIDNEY A. DIAMOND

Attesting Officer

Commissioner of Patents and Trademarks